United States Patent
Belady

(10) Patent No.: US 6,377,453 B1
(45) Date of Patent: Apr. 23, 2002

(54) FIELD REPLACEABLE MODULE WITH ENHANCED THERMAL INTERFACE

(75) Inventor: Christian L Belady, McKinney, TX (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/535,090

(22) Filed: Mar. 24, 2000

Related U.S. Application Data

(63) Continuation-in-part of application No. 09/300,350, filed on Apr. 27, 1999, which is a continuation-in-part of application No. 09/240,266, filed on Jan. 29, 1999.

(51) Int. Cl.$^7$ .................................................. H05K 7/14
(52) U.S. Cl. ........................ 361/687; 361/692; 361/726; 257/719; 174/16.3; 165/185
(58) Field of Search ................................ 361/683–685, 361/687–690, 695, 697, 704–710, 714–720, 846, 848, 686, 692, 727–729, 742, 756; 257/706–727, 732, 731, 625, 796; 165/80.2, 80.3, 80.4, 165, 185, 104.33, 121.122, 104.32; 174/16.3

(56) References Cited

U.S. PATENT DOCUMENTS

| | | | | |
|---|---|---|---|---|
| 4,092,697 A | * | 5/1978 | Spaight ....................... | 361/386 |
| 4,765,400 A | * | 8/1988 | Chu et al. ................... | 165/185 |
| 4,771,365 A | * | 9/1988 | Cichoki et al. ............. | 361/387 |
| 4,800,956 A | * | 1/1989 | Hamburgen ................ | 165/185 |
| 5,052,481 A | * | 10/1991 | Horvath et al. ............. | 165/185 |
| 5,094,769 A | * | 3/1992 | Anderson et al. ............ | 252/71 |
| 5,220,804 A | * | 6/1993 | Tilton et al. .................. | 62/373 |
| 5,345,107 A | * | 9/1994 | Daikoku et al. ............. | 257/717 |
| 5,608,610 A | * | 3/1997 | Brzezinski et al. ......... | 361/704 |
| 5,705,850 A | * | 1/1998 | Ashiwake et al. .......... | 257/714 |
| 5,763,951 A | * | 6/1998 | Hamilton et al. ........... | 257/714 |
| 5,838,065 A | * | 11/1998 | Hamburgen et al. ........ | 257/722 |
| 5,880,930 A | * | 3/1999 | Wheaton ..................... | 361/690 |
| 5,905,636 A | * | 5/1999 | Baska et al. ................. | 361/705 |

\* cited by examiner

*Primary Examiner*—Leo P. Picard
*Assistant Examiner*—Michael Datskovsky

(57) ABSTRACT

A self-contained field replaceable module that is adapted for low thermal resistance slideable contact with a heat sink that does not require interface pressure to ensure the contact and that is tolerant of misalignment is presented. The invention includes an interdigitated arrangement of the heat sink and field replaceable module. The field replaceable module includes a lid which forms a sealed cavity around at least one electronic component on the printed circuit board of the field replaceable module. The lid provides spray cooling or conduction cooling to the sealed electronic components. The lid includes a major surface having digit members extending longitudinally therefrom. The heat sink includes a major surface having digit members extending longitudinally therefrom. The digit members of the heat sink and field replaceable module are arranged in interdigitated arrangement for transferring heat from the field replaceable module to the heat sink. The digit members of the field replaceable module are particularly adapted and arranged for slideable contact with the digit members of the heat sink, so as to provide for ease of maintainability and exchangeability of the field replaceable module.

14 Claims, 12 Drawing Sheets

FIELD REPLACEABLE MODULE WITH ENHANCED THERMAL INTERFACE

CROSS REFERENCE TO RELATED APPLICATION

This is a continuation-in-part of copending application Ser. No. 09/300,350 filed Apr. 27, 1999 which is a Continuation in Part of Ser. No. 09/240,266 filed Jan. 29, 1999.

FIELD OF THE INVENTION

The present invention pertains generally to cooling of electronic components, and more particularly to thermal interfaces of field replaceable modules.

BACKGROUND OF THE INVENTION

Operation of high speed electronic components produces unwanted heat. For example, high speed computer processor elements such as microprocessors, graphics processors and the like generate unwanted heat that must be removed for efficient operation. Heat removal provides for a lower operating temperature, higher operating speeds and greater computing power. Additional advantages include higher reliability and availability.

To meet ever higher requirements for computing power, processor designs continue to evolve, becoming more complex and operating at ever higher speeds. More complex designs integrate greater and greater numbers of transistors, which each contribute to generation of more heat during operation. As each transistor is operated at higher speeds, heat generation is further increased.

Various cooling schemes are known in the prior art. In general, as cooling schemes become more efficient at removing heat, mechanisms to implement the schemes become larger, heavier, bulkier and more difficult to arrange in computer systems.

The large amount of power required to operate high speed computer systems results in large heat dissipation. Accordingly, cooling techniques are required. In some cooling schemes of the prior art, bulky mechanisms such as heat sinks (including cold plates) for implementing the schemes mechanically interfere with field replacement of modules, including processor modules, board modules, system modules and the like. Additionally, there is a problem of thermal interface resistance between the field replaceable module and the heat sink.

In general, thermal interface resistance is the result of imperfect mechanical contact between two opposing surfaces (i.e., between a lid of an integrated circuit package (or other field replaceable module) and heat sink). This imperfect mechanical contact results from collision of irregular "peak and valley" surface defects on both opposing surfaces.

With a substantial amount of contact occurring only at where the peaks collide, there is a bottleneck restriction for the heat flow, since the space in the valleys is either air or a vacuum. Air is a poor conductor of heat.

Depending on the nature of the irregular surface defects, thermal interface resistance per unit area can be one Inch squared-degree Centigrade per Watt of heat. For a typical processor application, this translates to about a 20° C. to 30° C. rise. Since interface resistance is a function of area, the smaller the interface area, the higher the resistance. For this reason, this phenomena is becoming more and more critical in the electronics cooling area since semiconductor package footprints are getting smaller, with higher heat fluxes. The equation for thermal resistance can be represented with the following equation:

$$R_{interface} = C/A$$

where C=interface resistance per unit area and A=Area of interface.

A number of different schemes to eliminate such irregular surface defects or to obviate thermal effects of their collision are known in the prior art.

1) Diamond Turned Surfaces—One method for improving the interface resistance between materials is to substantially eliminate irregular surface defects on the mating surfaces. Diamond turned surfaces have mirror-like surfaces that are typically used in optics. Although the interface performance is quite good, it is not very popular because it is extremely expensive. In addition, high pressure is needed for interface contact. This method is only used where longitudinal axis tolerance is tightly controlled (wherein the longitudinal axis is understood to be perpendicular to a major surface of the lid of an integrated circuit package (or other field replaceable module).

2) Thermal Grease—Thermally enhanced greases have been popular for years. They fill the voids created by the valleys in the irregular surface defects. Although the conductivity is still orders of magnitude lower than that of metals, it is still orders of magnitude better than air. Thus, C, the thermal resistance per unit area, decreases. This method is only used where longitudinal axis tolerance is tightly controlled.

The problems associated with grease are:

Grease migrates and is messy.

Grease is hard to control, too much grease will actually decrease thermal resistance since the peaks of the two surfaces may not be touching. For this reason manufacturing does not like to use grease.

In some cases, grease may migrate out of the interface area as a result of temperature cycling. This phenomenon is commonly known as "pumping".

Grease can age and separate resulting in decreased performance.

Moderate pressure is needed on the interface to ensure contact.

3) Thermal Pads—Pads are currently the most popular interface enhancement method. They are generally thermally enhanced silicone based pads that range in thickness of 3–20 mils. This method is only used where longitudinal axis tolerance is moderately controlled. The popularity of these pads has grown in recent years because they are easy to use during manufacturing with a well controlled attach method. In addition, it can be pre-applied to the interface. The problem with this method is that the thermal resistance is generally more than a factor of two higher than grease. In many applications this is not good enough. In addition, these pads need interface pressures greater than one-hundred pounds-per-square-inch (100 psi) to work.

4) Gap Pads—These are interface pads that fill gaps that are sixty to two-hundred thousandths of an inch (60–200 mils) thick. They provide some limited advantages for interfaces where gap tolerance is not well controlled. However, a major problem is that their resistance is generally ten to twenty times higher than standard thermal pads. Accordingly, in general, they are not suited for high heat flux applications. Moderate interface pressures are needed for optimum performance.

5) Phase Change Materials (PCM)—Another popular interface material are PCMs. The most common are paraffins that come on a thin carrier (2–5 mils) such as aluminum or a screen. These PCMs work on the principle that above a certain temperature such as 51° C., they reflow and fill the voids in the interface. The performance is comparable to that of grease. The carrier makes the use of PCMs easy to implement in manufacturing and easy to use. Moderate pressure is needed on the interface. This method is only used where longitudinal axis tolerance is tightly controlled.

6) Metal Pastes—Metal pastes are not commercially used because they are electrically conductive and poisonous.

In all cases discussed previously herein, some pressure is needed for the interface solution to perform. In each case it is beneficial to minimize the interface material to lower the thermal resistance. In addition, none of the above solutions lend themselves well for a sliding contact.

Liquid cooling methods, in which a liquid is pumped through a cold plate coupled to an integrated finned heat sink, is becoming more popular for use in larger modules such as processor modules, board modules, and system modules. The liquid conduits are typically coupled to the modules themselves and therefore mechanically interfere with the field replacement of modules. In particular, due to the liquid coupling between the modules and chassis, the liquid conduits coupled to the modules must be disconnected prior to exchanging modules. This results in a less efficient field replaceable module exchange method and is prone to leakage of the liquid from the disconnected conduits. In addition, this makes "hot swapping" of modules, which is becoming more and more important in larger systems or in mission-critical systems that require redundancy due to the need to provide "always-on" service, impossible. As used herein, the term "hot swap" refers to the ability of a field replaceable module to be connected to and disconnected from a computer system while the computer system is running and without interrupting operation of the computer system. In other words, the ability to exchange modules while the power is on and the system is running without adverse effect.

Accordingly, what is needed is an easily manufacturable, maintainable and exchangeable field replaceable module and cooling technique that is adapted for low thermal-resistance slideable contact with a heat sink, that does not require interface pressure to ensure the contact, and that is tolerant of misalignment. What is also needed is a liquid cooling method that does not couple the liquid conduits between the module and chassis and therefore does not require disconnection during field replaceable module exchange or risk liquid leakage during the exchange.

SUMMARY OF THE INVENTION

The invention provides for ease of manufacturability, maintainability and exchangeability in a field replaceable module that is adapted for low thermal resistance slideable contact with a heat sink, that does not require interface pressure to ensure the contact, and that is tolerant of misalignment. All liquid cooled surfaces are built independently into the chassis and/or module, eliminating liquid coupling between the modules and chassis. Thus, no disconnection of liquid conduits is required when exchanging field replaceable modules. In addition, in mission-critical computing, the modules can be hot-swapped while the system is running.

The self-contained field replaceable module includes a lid which forms a sealed cavity around at least one electronic component on the printed circuit board of the field replaceable module. The lid provides self-contained spray cooling or conduction cooling to the sealed electronic components.

Briefly and in general terms the invention includes an interdigitated arrangement of the heat sink and the field replaceable module. The heat sink includes a major surface having digit members extending longitudinally therefrom. The field replaceable module includes a major surface having digit members extending longitudinally therefrom, and arranged in interdigitated contact with the digit members of the heat sink for transferring heat from the field replaceable module to the heat sink.

The digit members of the field replaceable module are particularly adapted and arranged for slideable contact with the digit members of the heat sink, so as to provide for ease of maintainability and exchangeability of the field replaceable module. For example, the invention includes exchanging a second field replaceable module for a first field replaceable module by sliding the first field replaceable module out of the interdigitated contact with the heat sink and then sliding the second field replaceable module into interdigitated contact with the heat sink. As described in further detail subsequently herein, the interdigitated contact has a low thermal resistance substantially within a range from approximately one hundredth of an Inch squared-degree Centigrade per Watt to approximately two tenths of an Inch squared-degree Centigrade per Watt, while still tolerating substantial longitudinal misalignment of the digit members of the heat sink and the field replaceable module. Additionally, the low thermal resistance is advantageously provided independent of any requirement for interface pressure applied to ensure the contact.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

Figure 1:
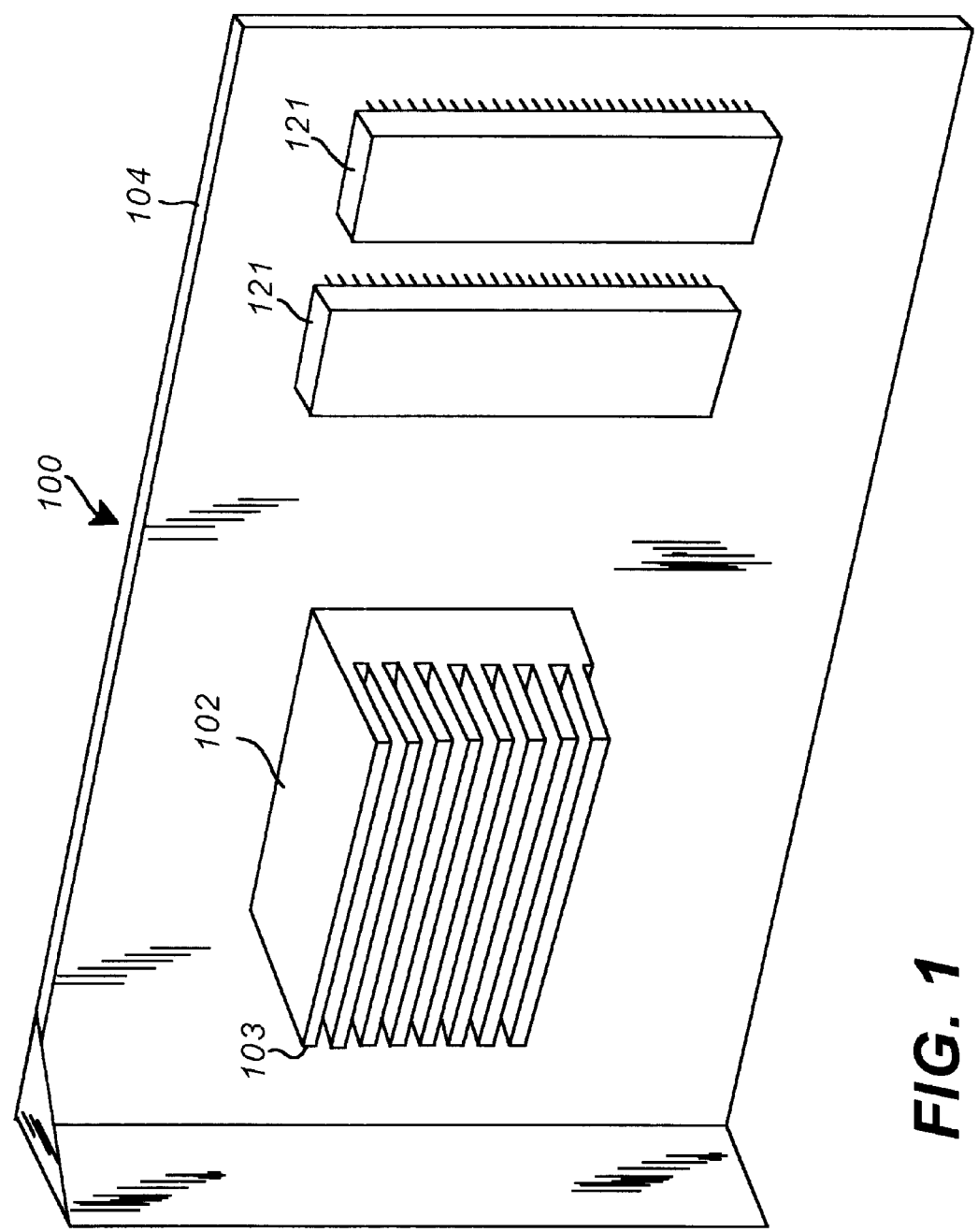
FIG. 1 is an isometric view of a field replaceable module of the invention.

FIG. 1 is a preferred embodiment of the field replaceable module 100 of the invention. In the preferred embodiment the field replaceable module 100 particularly includes one or more bare die or packaged electronic components 101 sealed by a lid 102. As shown, regular digit members 103 extend longitudinally from a major surface of the lid 102.

Figure 2A:
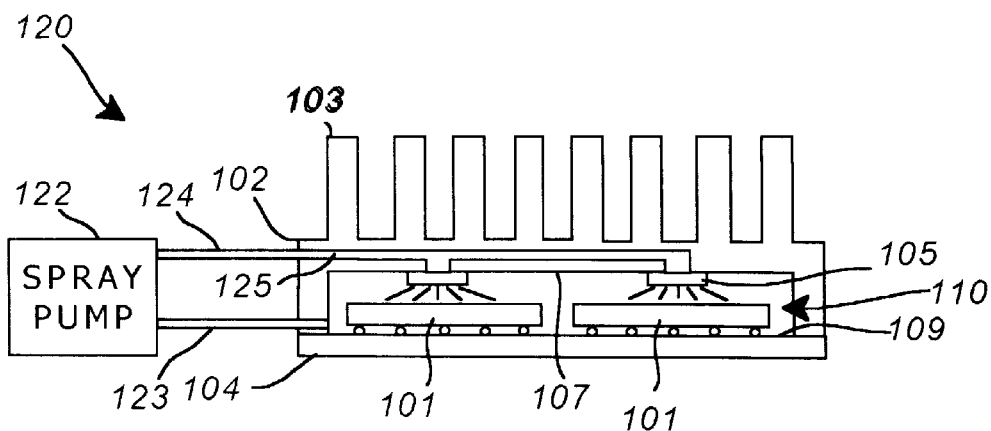
FIG. 2A is a cross-sectional view of a first embodiment of field replaceable module in accordance with the invention.
Figure 2B:
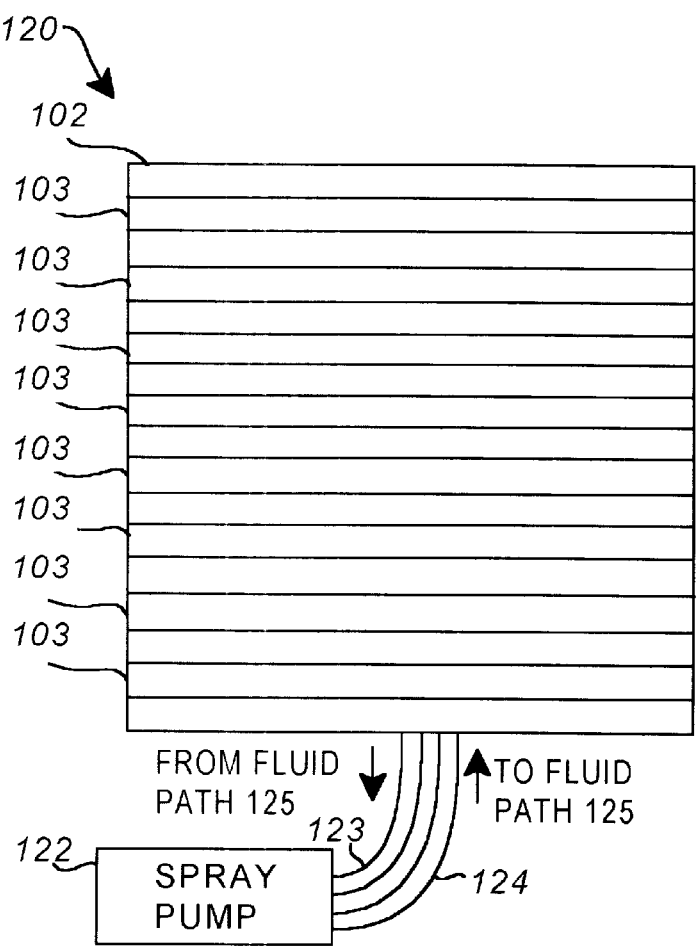
FIG. 2B is a top view of a first embodiment of field replaceable module in accordance with the invention.
Figure 2C:
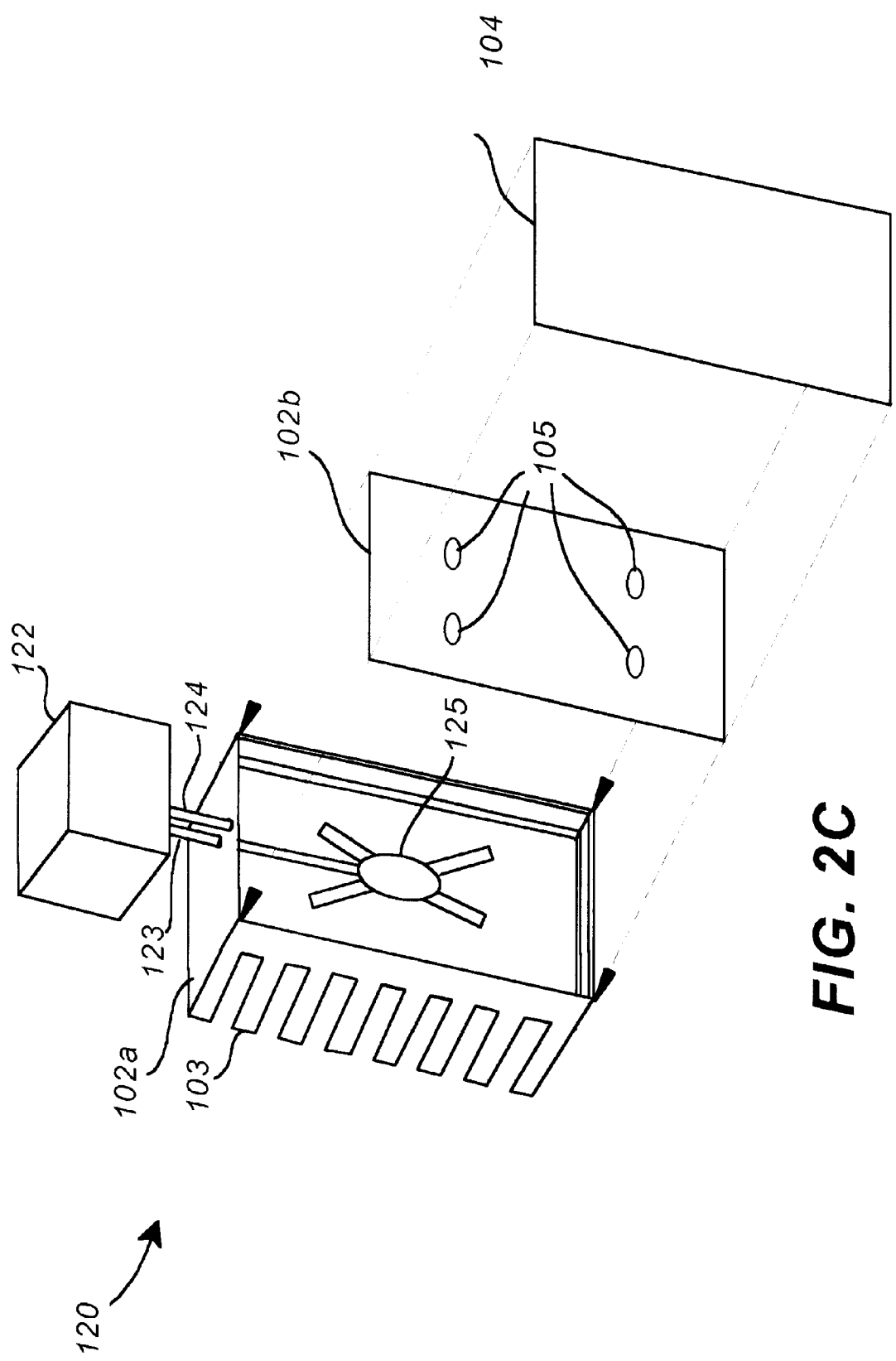
FIG. 2C is an exploded isometric view of a first embodiment of field replaceable module in accordance with the invention.

FIG. 2A is a cross-sectional view, FIG. 2B is a top view, and FIG. 2C is an exploded isometric view, of a first embodiment 120 of field replaceable module 100 in accordance with the invention. In this embodiment, field replaceable module 120 is a spray cooled module, wherein lid 102 comprises an inner cavity 110 which completely covers electronic components 101 when lid 102 is positioned over the electronic components 101. In this embodiment, lid 102 is positioned over one or more electronic components 101 and sealed to the printed circuit board 104 to form a shielded cavity 110 with electronic components 101 therein. This has the added advantage of providing electro-magnetic interference (EMI) containment, which is typically difficult to contain on a large module. The sealant is preferably an epoxy or solder, but can be mechanical with an O-ring or gasket.

In the spray cooled embodiment of FIGS. 2A, 2B, and 2C, lid 102 is liquid cooled. In particular, lid 102 comprises a cold plate 102a having a flow path 125 therethrough for circulating a cooling fluid (e.g., fluorinerts, or other known cooling fluids). The flow path 125 is preferably a manifold as shown in FIG. 2C. A spray pump 122 is liquid coupled to the flow path 125 via a fluid conduit 123, and pumps the cooling liquid through the flow path 125. The flow path 125 is coupled to a plurality of spray nozzles (FIGS. 2A and 2C) on the inner lid plate 102b which spray the liquid into the sealed cavity 110. Preferably, spray nozzles 105 are positioned to spray liquid over each of electronic components 101.

FIG. 2C is an exploded isometric view of lid 102 revealing the manifold flow path 125 for distributing the cooling fluid. In the preferred embodiment, the manifold is in fluid communication with each of the spray nozzles 105 via distribution channels 106. The manifold 125 and distribution channels are machined to extend into the constituent plates 102a, 102b, which may be made of copper, aluminum, stainless steel, or other material. Copper is preferred to resist corrosion. The constituent plates are brazed to seal the lid 102 against any unwanted leakage of the fluid.

It should be understood that alternate arrangements of the flow path 125 may be made. In an alternative embodiment, instead of a serpentine channel, folded finstock is used to provide for the circulation of the fluid. The folded finstock is brazed between two constituent plates of the lid to seal the lid against any unwanted fluid leakage.

In the spray-cooled embodiment of FIGS. 2A, 2B, and 2C, the field replaceable module 120 is a self-contained module with a pump 122. The pump 122 circulates the cooling fluid through the flow path 125 and through the spray nozzles 105 into the sealed cavity 110. The heat from the electronic components 101 vaporizes the liquid, transferring the heat from the electronic components 101 to the vapor. The inner lid plate 102b is cooled by plate 102a, which is cooled as discussed hereinafter, causing the vapor to condense on the inner surface 107 of the inner lid plate 102b. During condensation, the heat of the vapor is transferred from the vapor to the inner lid plate 102b, which is then transferred to plate 102a and to longitudinal digits 103, which are cooled as described hereinafter. The condensed liquid is returned to spray pump 122 from the sealed cavity 110 via conduit 124, thereby forming a continuous liquid loop.

Figure 3A:
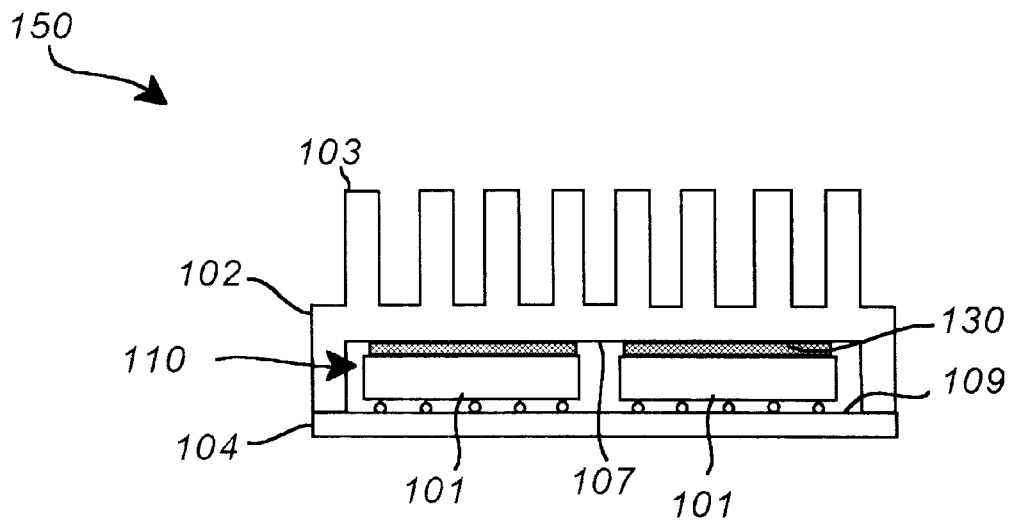
FIG. 3A is a cross-sectional view of a second embodiment of field replaceable module in accordance with the invention.
Figure 3B:
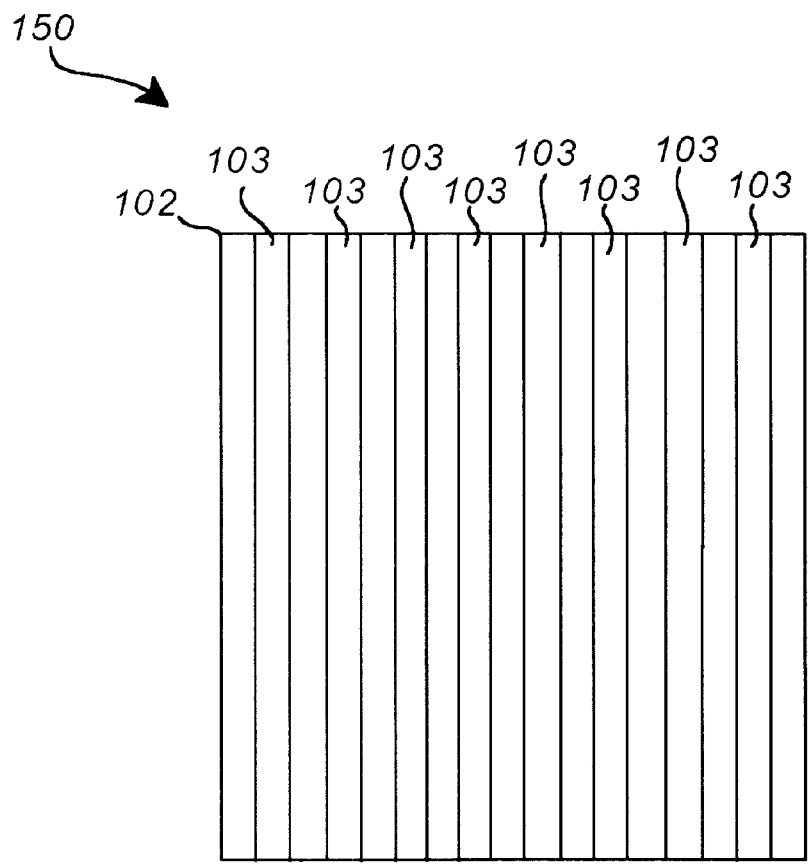
FIG. 3B is a top view of a second embodiment of field replaceable module in accordance with the invention.

FIG. 3A is a cross-sectional view, and FIG. 3B is a top view, of a second embodiment 150 of field replaceable module 100 in accordance with the invention. In this embodiment, field replaceable module 150 is a conduction module, wherein lid 102 comprises an inner cavity 110 which completely covers electronic components 101 when lid 102 is positioned over the electronic components 101. In this embodiment, lid 102 is positioned over one or more electronic components 101 such that the inner surface 107 of the lid 102 makes as much contact as possible with the electronic components 101 within the cavity 110. An interface enhancement material 130 such as thermal grease, thermal pads, gap pads, phase change materials, or epoxy, is used to improve the interface resistance between the inner surface 108 of lid 102 and the top surfaces of the electronic components 101 that are sealed in the cavity 110. The interface enhancement material 130 is placed in conductive contact between the tops of electronic components 101 and the inner surface 107 of lid 102 with enough pressure to yield effective interface resistance improvement. Preferably, lid 102 is sealed to the printed circuit board 104 to form a shielded cavity 110 with electronic components 101 therein. This has the added advantage of providing electromagnetic interference (EMI) containment, which is typically difficult to contain on a large module. The sealant is preferably epoxy or solder, but can be mechanical with an O-ring or gasket.

Referring back to FIG. 1, the digit members 103 are preferably made by machining or cold forging such surface features of the lid. The lid may be made of materials such as copper, aluminum, stainless steel, or other materials.

Preferably, a longitudinal dimension of each digit measures within a range of approximately a quarter of an inch to approximately one inch; and a lateral dimension of each digit (and of each corresponding kerf adjacent thereto) measures within a range of approximately twenty mils to approximately fifty mils, so as to provide a preferred number of approximately ten to twenty digits per lateral inch across the major surface of the lid 102.

In the preferred embodiment, the field replaceable module 100 includes a printed circuit board 104. Additional integrated circuit packages (for example, memory modules 121) and the one or more electronic components 101 (for example a packaged microprocessor) are each soldered or otherwise electrically coupled with conductive traces of the printed circuit board 104, to provide for electrical coupling between the memory 121 and the microprocessor 101 and for conducting electrical signals therebetween.

It should be understood that while the field replaceable module 100 is preferably embodied as shown in FIG. 1 including the printed circuit board 104 and bare die or packaged electronic components 101 sealed by lid 102, the principles of the invention are not strictly limited to such an embodiment, since the field replaceable module of the invention may be otherwise embodied, with beneficial results, employing the lid 102 sealed over any, all, or any combination of the electronic components on the printed circuit board 104.

Figure 4A:
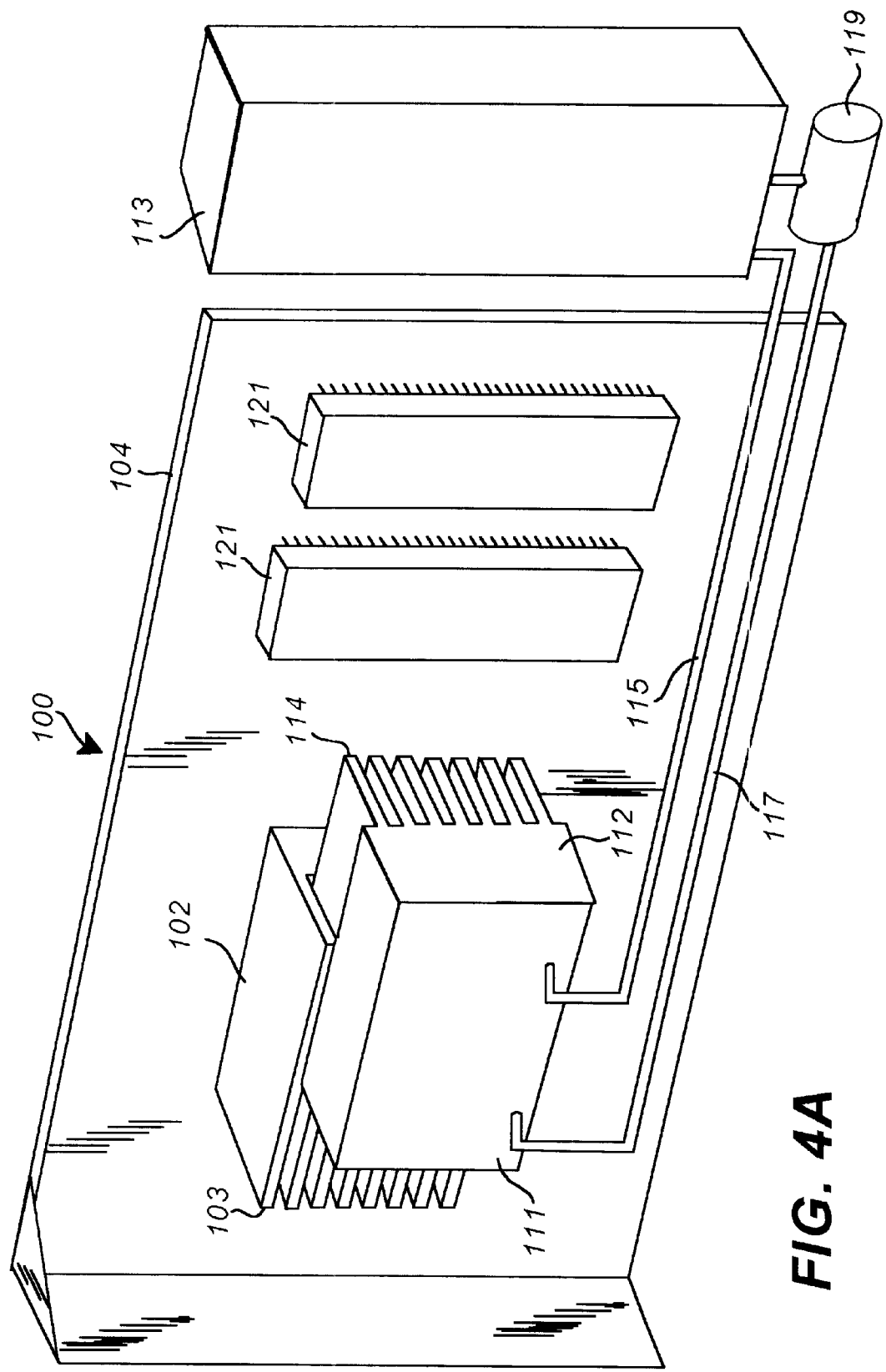
FIGS. 4A and 4B are isometric views of a preferred embodiment of the invention, illustrating a slidable aspect of the invention.
Figure 4B:
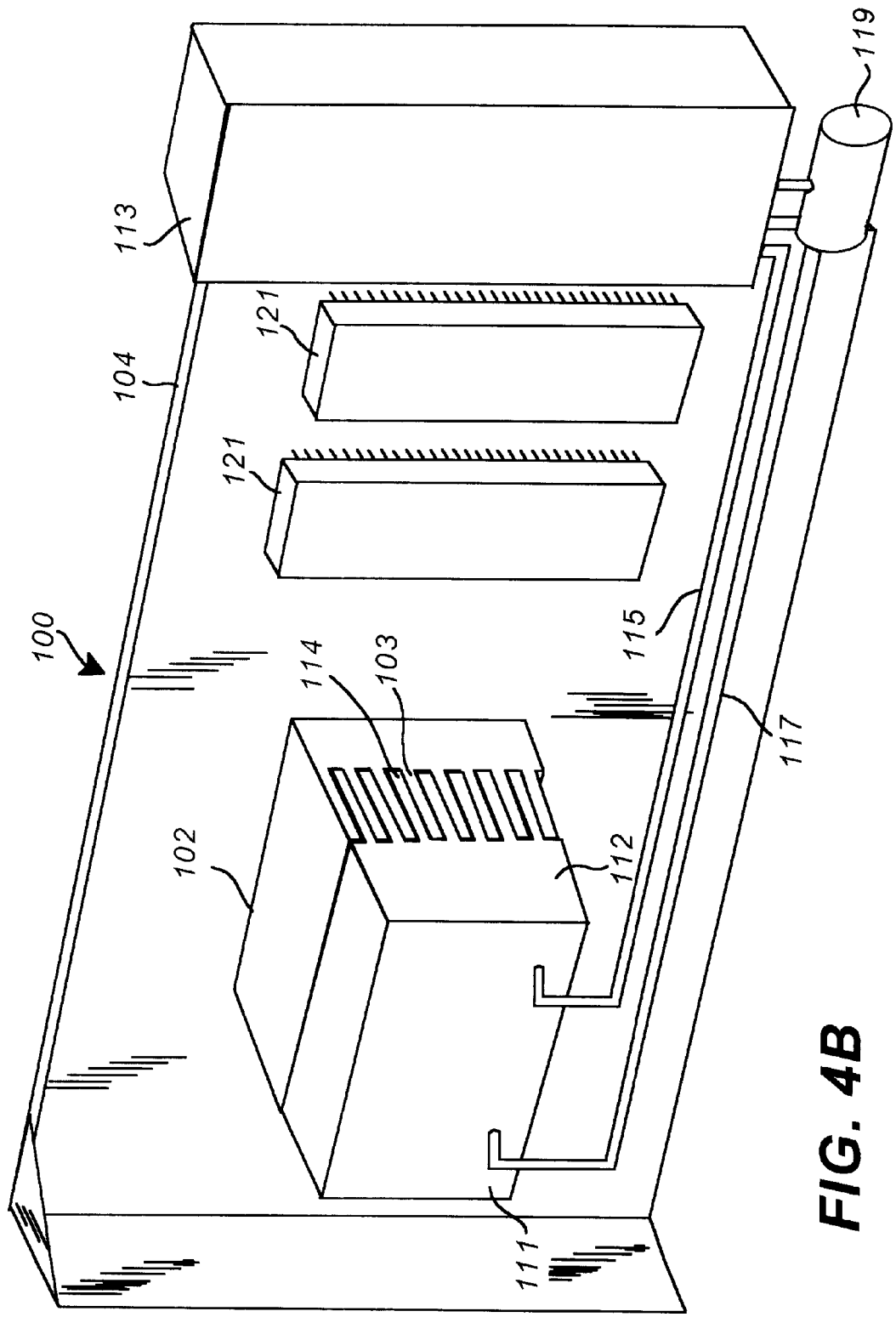

FIGS. 4A and 4B are isometric view of a preferred embodiment of the invention, illustrating a slidable aspect of the invention, and illustrating how the invention provides for ease of manufacturability, maintainability and exchangeability of the field replaceable module 100. As shown in FIGS. 4A and 4B, the invention also includes an interdigitated arrangement of a heat sink 111 and the field replaceable module 100. The heat sink 111 is preferably embodied in a cold plate 112 that includes a major surface having regular digit members 114 extending longitudinally therefrom, wherein such digit members 114 are dimensioned and manufactured in a similar manner as discussed previously herein with respect to the digit members 103 of the lid 102 of field replaceable module 100. It should be understood that while it is preferred that the heat sink 111 be embodied in the cold plate 112, the invention is not limited to such embodiment, and other embodiments of the heat sink, wherein the heat sink includes a major surface having regular digit members 114 extending longitudinally therefrom, are employed with beneficial results.

As shown, the digit members 103 of the lid 102 of the field replaceable module 100 are arranged in interdigitated arrangement with the digit members 114 of the heat sink 111 for transferring heat from the field replaceable module 100 to the heat sink 111. Preferably, such digit members 103 of the lid 102 are particularly adapted and arranged for slideable contact with the digit members 114 of the heat sink 111, so as to provide for ease of maintainability and exchangeability of the field replaceable module 100. In FIG. 4A, the field replaceable module 100 is in a process of sliding into place. In FIG. 4B the process is completed and the field replaceable module 100 is fitted into place.

In FIG. 4B, from a point of view of a footprint area of the lid 102, as projected unto the printed circuit board 104, the interdigitated contact has a low thermal resistance substantially within a range from approximately 0.01 Inch squared-degree Centigrade per Watt to approximately 0.2 Inch squared-degree Centigrade per Watt, while still tolerating substantial longitudinal misalignment of the digit members 114 of the heat sink 111 and the digit members 103 of field replaceable module 100. For the invention, such low thermal resistance is achieved without being burdened by any use of thermal grease or thermal pads, and their attendant difficulties. Additionally, the low thermal resistance is advantageously provided independent of any requirement for interface pressure applied to ensure the contact.

In accordance with an advantageous aspect of the low thermal resistance, the cold plate draws more than 130 W of heat from the lid 102 of the field replaceable module 100 as the cooling fluid is circulated through the cold plate 112, so as to maintain an operating temperature of the cold plate 112 within a range from approximately 60° C. to approximately 70° C., assuming a typical ambient temp of 35° C. It is theorized that the cold plate 112 could handle much more heat, depending upon factors such as increasing rate of fluid flow, or employing a larger heat exchanger. A preferred flow rate is approximately one-tenth to two-tenths of a gallon per minute for each integrated circuit package cooled, however it should be understood that the invention is not limited to the preferred flow rate.

A heat exchanger 113 is thermally coupled in fluid communication with the cold plate 112 for drawing heat therefrom. The design of the heat exchanger 113 may be tube-in-fin, plate cold plate, or other suitable design. The heat exchanger 113 may be fabricated for a preferred copper, or from aluminum, stainless steel or composite. The cold plate 112 and heat exchanger 113 each include respective flow paths 116, 118 therethrough for circulating a cooling fluid, for example water, ethylene glycol mixed with water, fluorinerts, or other suitable fluids known to those with ordinary skill in the art. The flow paths 116, 118 are preferably either serpentine liquid conduits or fin-stock through which the liquid is pumped.

As shown in FIG. 4B, the invention includes a pair of fluid conduits 115, 117 coupled with the flow paths 116 of the cold plate 112 and the flow paths 118 of the heat exchanger 113 for circulating the fluid therebetween. In the preferred embodiment, the fluid conduits 115, 117 are made from quarter inch (or half inch) diameter hollow copper tubing, or another suitable material.

In the preferred embodiment, an electric pump 119 is coupled in line with one of the fluid conduits 117 to promote circulation of the fluid. Various different electric pumps provide desirable results. It is preferred to use magnetically coupled pumps so as to seal completely the fluid circulation. Such pumps are generally available from manufacturers, for example Iwaki Welchem or Gorman Rupp.

Taken together, FIGS. 4A and 4B particularly illustrate the slidable aspect of the invention. It should be understood that the process as illustrated in the figures is reversible and repeatable. In accordance with the principles of the invention, a second one of the field replaceable modules is easily exchanged for a first one of the field replaceable modules by sliding the first field replaceable module out of the interdigitated contact with the cold plate 112 and then sliding the second field replaceable module into interdigitated contact with the cold plate 112. This advantageously accomplished without unduly disturbing the arrangement of the cold plate 112 and the associated conduits 115, 117, heat exchanger 113, and pump 119. This aspect of the invention is particularly advantageous when durability of rigid conduit is desired, without sacrificing ease of exchangeability of the field replaceable module 100.

Figure 5B:
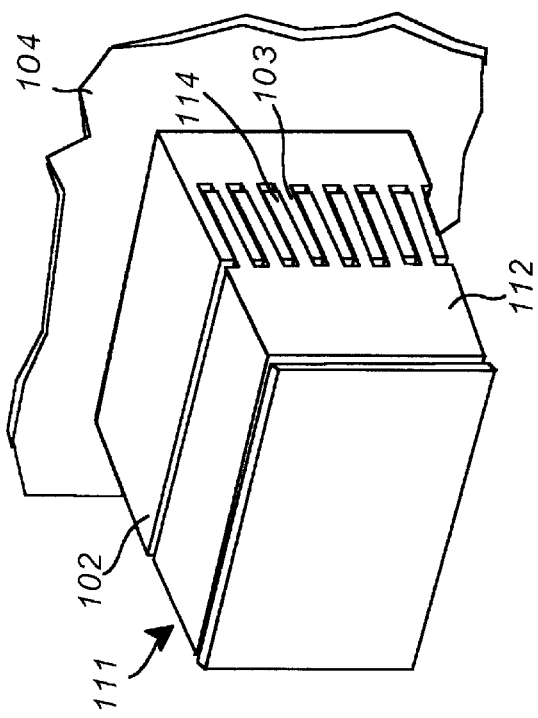
FIG. 5B is a detailed view of FIG. 5A after a substantial longitudinal misalignment has been introduced.
Figure 5A:
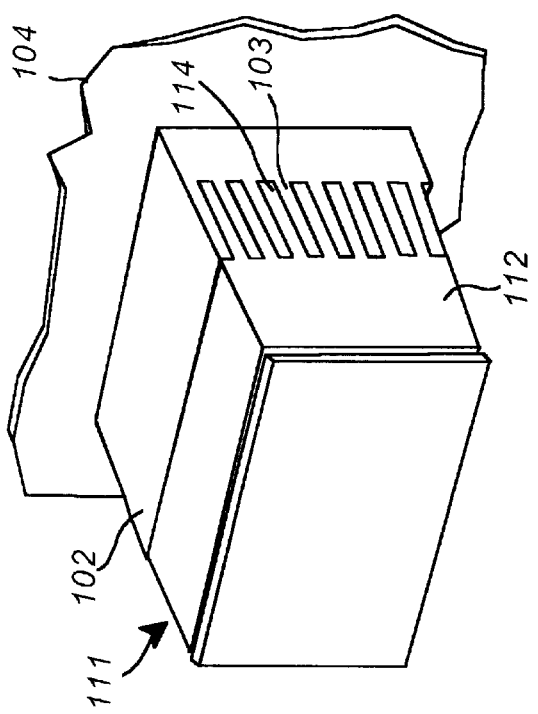
FIG. 5A is a detailed view of FIG. 4B.

FIG. 5A is a detailed view of FIG. 4B, illustrating arrangement and interdigitated contact of the heat sink 111 and the field replaceable module lid 102 shown in FIG. 1. In the preferred embodiment, the cold plate 112 is fabricated from a clam-shell arrangement of two thinner constituent plates 112a, 112b sealed together and having a serpentine channel or cavity extending therethrough for circulating for circulating the cooling fluid for heat transfer. It is theorized by the inventor for efficient heat transfer to the fluid, the serpentine channel should have a preferred diameter within a range from approximately 0.16 inch to approximately 0.2 inch in diameter. Though some beneficial results may be achieved with smaller channel diameters, these preferred channel diameters require a sufficient total thickness so as to maintain structural integrity of the constituent plates and efficient heat transfer from the constituent plates.

The cold plate should be large enough for thermal coupling with the lid 102 of the field replaceable module 100, and furthermore should be large enough to provide or coupling to the fluid conduits. For example, in the case of the lid 102 having lateral and depth dimensions of approximately 3 inches by approximately 5 inches, it is preferred that each of the opposing major surfaces of the cold plate have lateral and depth dimensions of approximately 3.75 inches by approximately 5.75 inches. Of course, it should be understood that size of the cold plate 112 is varied for different size lids 102, in accordance with the principles of the invention.

FIG. 5B is a detailed view of FIG. 5A after a substantial longitudinal misalignment has been introduced. The interdigitated contact of the heat sink and the field replaceable module 100 is adapted to advantageously provide the low thermal resistance, while still tolerating the substantial longitudinal misalignment of the respective digit members 114, 103 of the heat sink 111 and the lid 102 of field replaceable module 100. For example, in the preferred embodiment (from the point of view of the footprint area of the lid 102, as projected unto the printed circuit board 104) the interdigitated contact has the low thermal resistance substantially within the range from approximately 0.01 Inch-squared—degree Centigrade per Watt, even when there is a substantial longitudinal misalignment as shown in FIG. 5B of (or example) approximately 0.1 inch.

Figure 6:
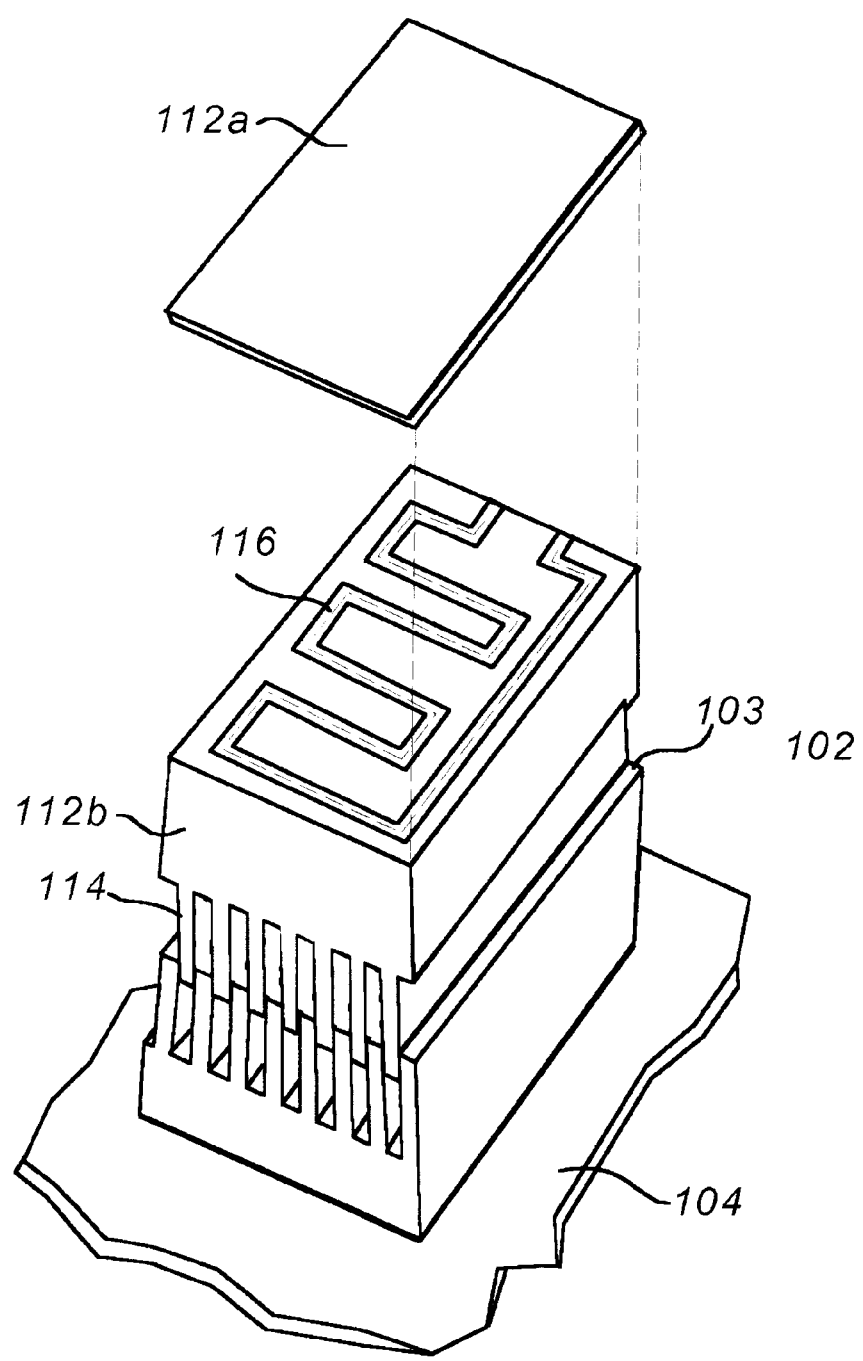
FIG. 6 is an exploded view of FIG. 5A.

FIG. 6 is an exploded view of FIG. 5A. For the cold plate 112, its clam-shell arrangement of two thinner constituent plates 112a, 112b sealed together are shown for illustrative purposes in FIG. 6 as exploded apart, so as to reveal the serpentine channel 116 extending therethrough for circulating the cooling fluid. In the preferred embodiment, the serpentine channel 116 is machined to extend into the constituent plates 112a, 112b, which may be made of copper, aluminum, or stainless steel. Copper is preferred to resist corrosion. A preferred length of the channel approximately 20 inches long. The constituent plates 112a, 112b are brazed to seal the cold plate 112 against any unwanted leakage of the fluid.

It should be understood that alternate arrangements of the channel may be made with beneficial results, depending on what temperature of the cold plate is desired. In an alternative embodiment, instead of a serpentine channel, folded finstock used to provide for the circulation of the fluid. The folded finstock is brazed between two constituent plates of the cold plate, to seal the cold plate against the unwanted leakage.

Figure 7:
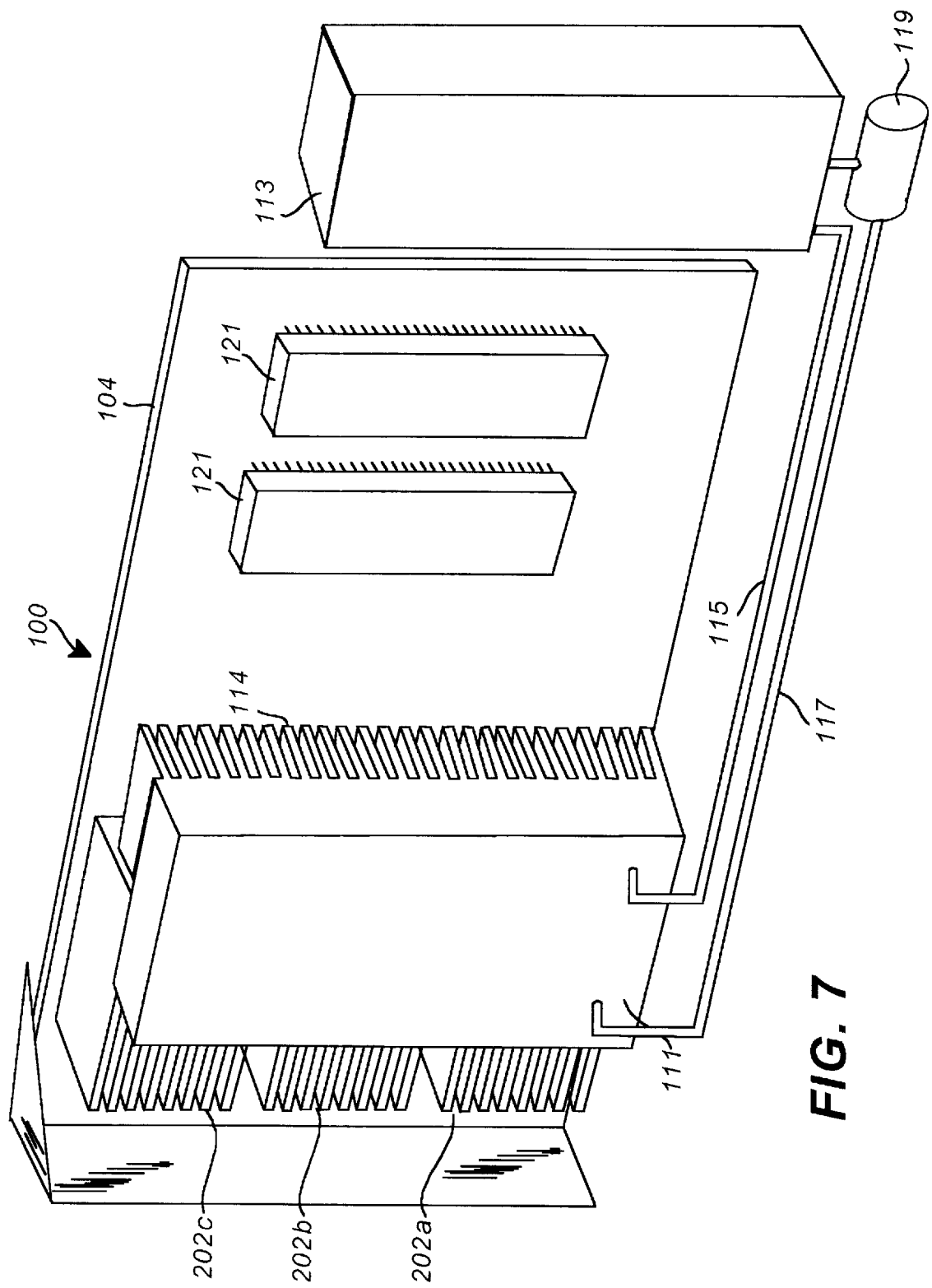
FIG. 7 shows an alternative embodiment of the invention.

FIG. 7 shows an alternative embodiment of the invention. In FIG. 7, the field replaceable module (which includes the major surface having digit members extending longitudinally therefrom) is embodied to include three lids 201, 202, 203, each covering one or more electronic components (not shown) and having respective digit members extending longitudinally therefrom, so as to provide for the interdigitated contact with the heat sink 111.

Figure 8A:
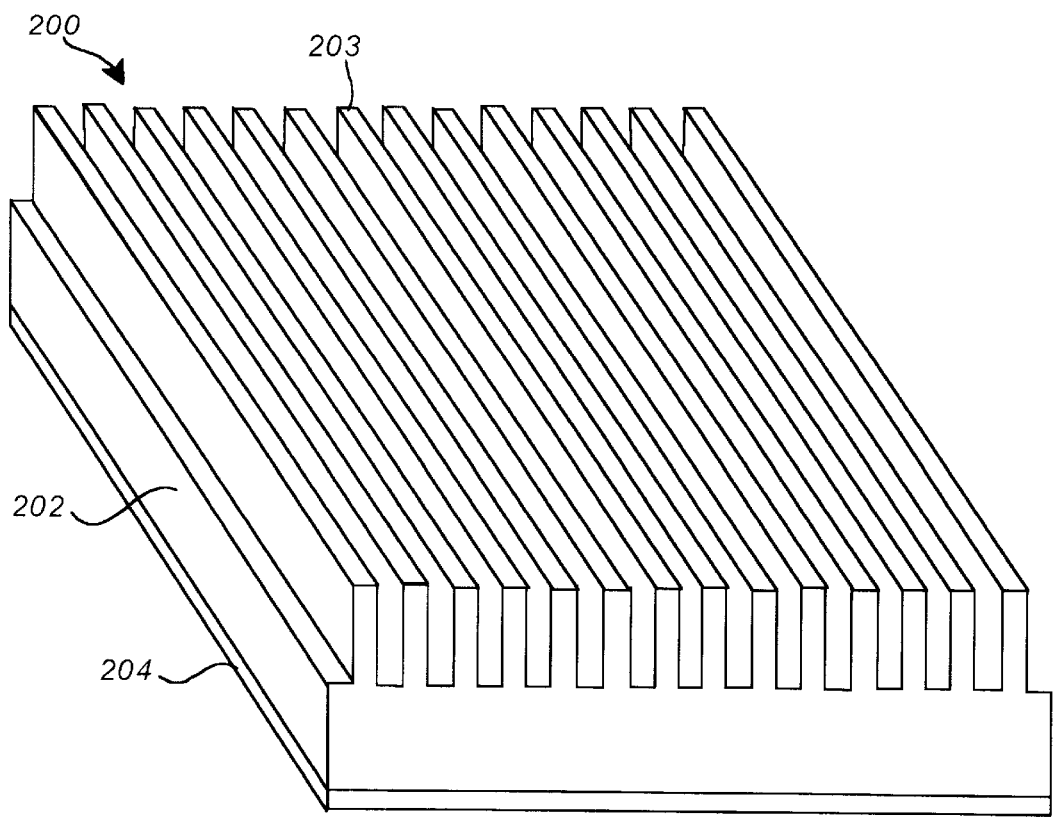
FIG. 8A is an isometric view of an alternative embodiment of the invention.

FIGS. 8A, 8B, 8C, and 9 together illustrated the preferred embodiment of the invention. FIG. 8A is an isometric view of the preferred embodiment of a field replaceable module 200 comprising a lid 202 that seals the entire printed circuit board 204 and all electronic components thereon to provide a self-contained module.

Figure 8B:
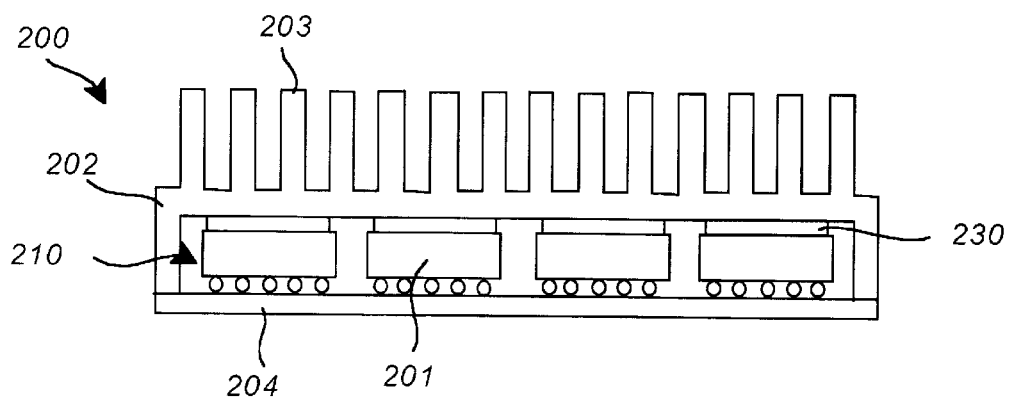
FIG. 8B is a cross-sectional view of the alternative embodiment of the invention shown in FIG. 8A.

FIG. 8B is a cross-sectional view of field replaceable module 200 implementing the conduction module of FIGS. 3A and 3B. As illustrated in FIG. 8B, a large number of electrically interconnected integrated circuits and other electronic components 201, forming a subsystem, are all packaged together on a printed circuit board 204 within the sealed cavity 210 of a single lid 202 of field replaceable module 200. The lid 202 is sealed to the printed circuit board 204, forming shielded cavity 210 to provide EMI containment as discussed previously. The integrated circuits and other electronic components 201 of the printed circuit board 204 are all thermally coupled via interface enhancement material 230 with the major surface 207 of the lid 202, wherein the digit members 203 are shown extending longitudinally therefrom. It should also be understood that field replaceable module 200 may also be implemented as the spray cooled module as described above and illustrated in FIGS. 2A, 2B and 2C.

Figure 8C:
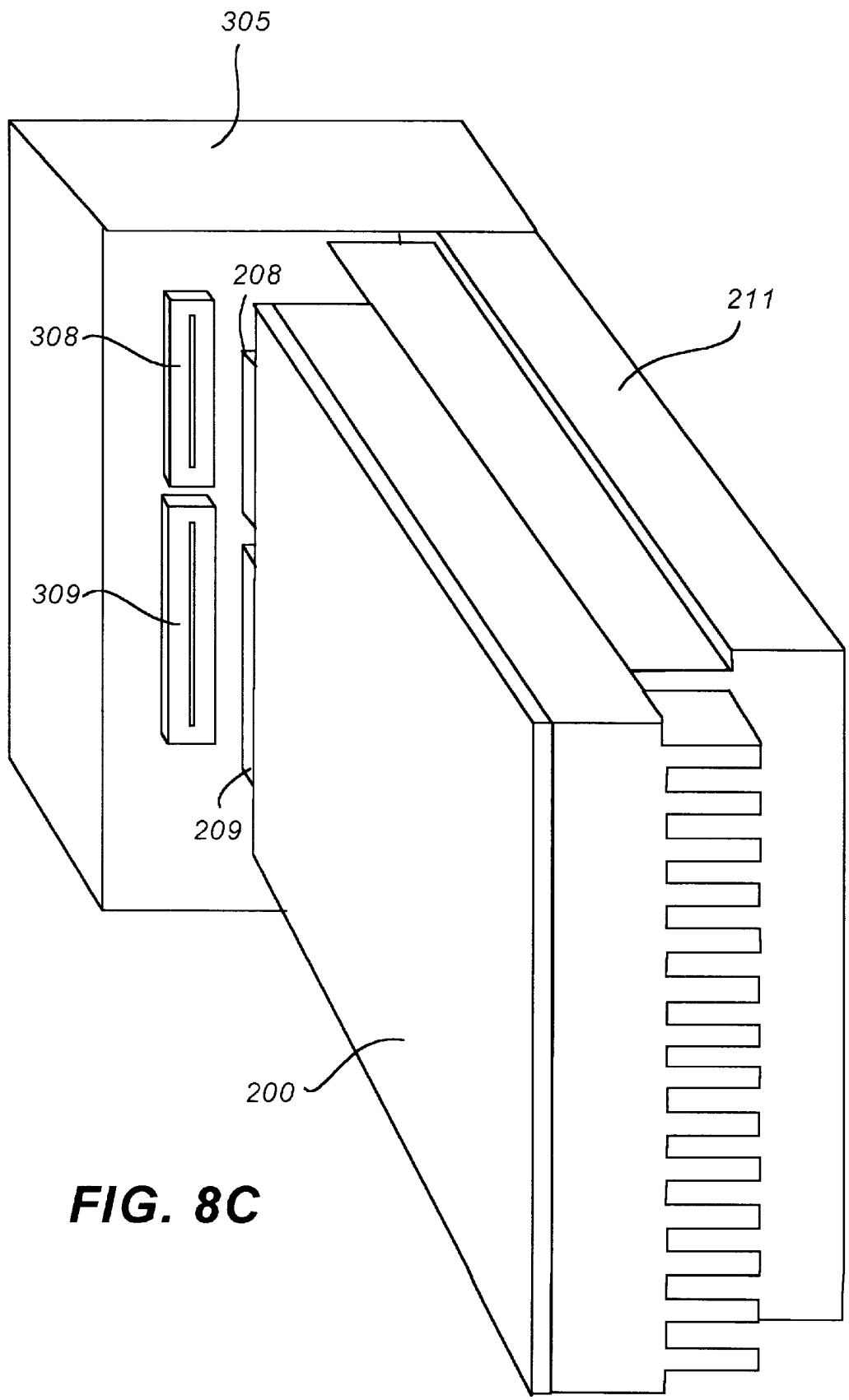
FIG. 8C is an isometric view of the field replaceable module of FIGS. 8A and 8B illustrating the slidable aspect of the invention with the non-movable heat sink/cold plate.

FIG. 8C is an isometric view of self-contained field replaceable module 200 in slidable arrangement with a heat sink 211. Heat sink 211 is integrated into a chassis (not shown in FIG. 8C but 300 in FIG. 9) and liquid coupled to a pump and heat exchanger 302 (FIG. 9) via conduits 251 and 252. Heat sink 211 is large enough to cool the entire field replaceable module 200. Heat sink 211 comprises a major surface having digit members 214 extending longitudinally therefrom. The digit members 214 of heat sink 211 are arranged in slidable interdigitated contact with the lid 202 of field replaceable module 200. Field replaceable module 200 includes backplane connectors 208 and 209 which couple to connectors 308 and 309 respectively of a backplane 305 to provide power and bus connections, and/or any other electrical connections, thereto.

Figure 9:
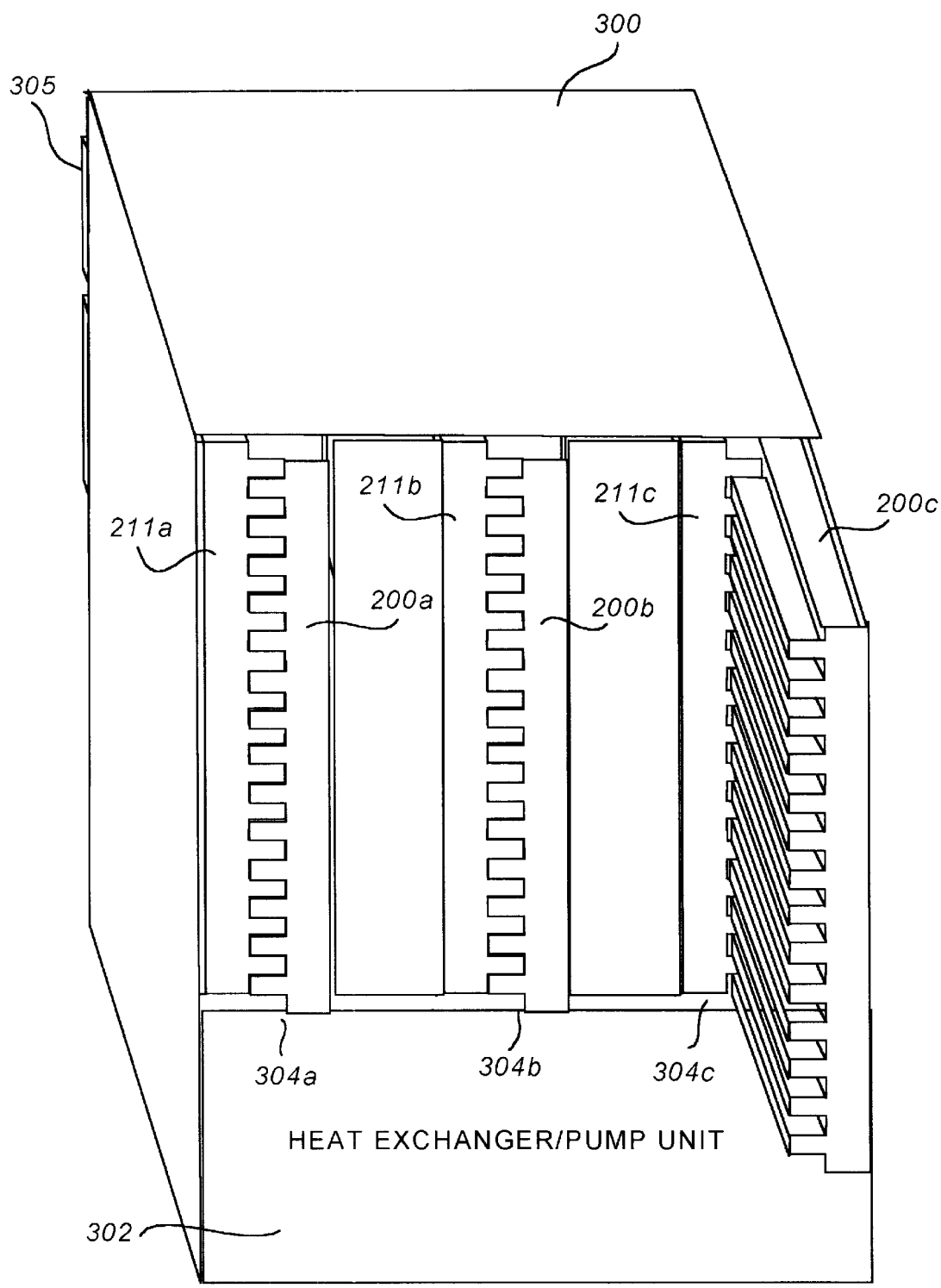
FIG. 9 is an isometric view of a chassis of the invention which houses a plurality of field replaceable modules of the invention and illustrates the self-containment and hot-swappable aspect of the invention.

FIG. 9 is an isometric view of a system chassis 300 of a computer system comprising a plurality of slots 304a, 304b, 304c, each holding a field replaceable module 200a, 200b, 200c that is connectable to a backplane 305 (for bus and power connection) and arranged in interdigitated contact with a respective heat sink 211a, 211b, 211c. The heat sinks 211a, 211b, 211c are integral components of the chassis 305 with digit members 214 (FIG. 8C) that interdigitate with the digit members 203 of the field replaceable modules 200a, 200b, 200c.

A heat exchanger/pump 302 provides all the hardware necessary for cooling the heat sinks 211a, 211b, 211c. In the preferred embodiment, heat exchanger/pump 302 is thermally coupled in fluid communication with the heat sinks 211a, 211b, 211c for drawing heat therefrom and includes a cooling ventilation system and an electric pump (not shown) to simultaneously cool and circulate cooling liquid to each of the heat sinks 211a, 211b, 211c within the chassis 300. The design of the heat exchanger 302 may be tube-in-fin, plate cold plate, or other suitable design, and is described above with respect to FIGS. 4A and 4B.

In FIG. 9, field replaceable modules 200a and 200b are shown seated in the chassis 300 and therefore connected to the backplane 305. Field replaceable module 200c is shown in the process of a field replaceable module exchange, in a similar manner as discussed previously herein with respect to FIG. 4A. Of course, such process is completed when the field replaceable module 200c is fitted into place, wherein the field replaceable module backplane connectors 208 and 209 (FIG. 8C) make electrical connection with the backplane connectors 308 and 309 (FIG. 8C) of the backplane 305. Accordingly, in FIG. 9, field replaceable module 200c is either sliding into slot 304c to replace the previous field replaceable module that occupied that slot, or sliding out of slot 304c to be replaced by another field replaceable module. During the sliding motion, field replaceable module 200c is not seated in the chassis and is therefore not connected to the backplane 305.

It will be appreciated from the above description and illustrative figures that the embodiment shown in FIGS. 8A, 8B, 8C, and 9, facilitate the following advantages. First, the field replaceable modules 200, 200a, 200b, 200c are entirely self-contained. No liquid coupling between the modules and chassis exists, and therefore, during module exchange, no disconnection of liquid conduits is required. This facilitates "hot swapping" of modules (i.e., the exchange of modules while the power is on and the system is running), which is becoming more and more important in larger systems or in systems that require redundancy due to the need to provide "always-on" service. Second, the lid 202 seals the entire printed circuit board 204, thereby containing EMI to the module itself and preventing slot-to-slot (or module-to-module) EMI. Heretofore, this has been achieved only at the chassis level.

As discussed, the invention provides for ease of manufacturability, maintainability and exchangeability in a field replaceable module that is adapted or low thermal resistance slideable contact with the heat sink, that does not require interface pressure to ensure the contact, and that is tolerant of misalignment. Within the scope of the appended claims, therefor, the invention may be practiced otherwise than as specifically described and illustrated.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A field replaceable module electrically connectable for operation to a computer system to allow for easy exchangeability of said field replaceable module in said computer system, said field replaceable module comprising:
   a printed circuit board;
   one or more electronic components electrically connected to said printed circuit board;
   a lid having an inner cavity therein, said lid sealed over at least one of said electronic components to seal said at least one electronic components within said inner cavity, said lid comprising a plurality of fins extending longitudinally from a major surface of said lid; and
   a self-contained liquid cooled system for transferring heat from said at least one electronic components sealed in said inner cavity to said lid, wherein said self-contained liquid cooled system comprises:
      a liquid flow path formed inside said lid;
      at least one spray nozzle coupled between said flow path and said inner cavity;
      a cooling liquid circulating in said flow path; and
      a spray pump which circulates said cooling liquid through said flow path thereby causing said cooling liquid to spray into said inner cavity through said at least one spray nozzle.

2. A computer system comprising:
   a chassis;
   a powered backplane having a backplane electrical connector;
   a heat sink fixedly mounted in said chassis and having a major surface with fins extending longitudinally therefrom;
   a field replaceable module comprising a field replaceable module electrical connector connectable to said backplane electrical connector, a printed circuit board electrically connected to said field replaceable module electrical connector, one or more electronic components electrically connected to said printed circuit board, a lid forming a sealed cavity over at least one of said one or more electronic components, and a self-contained heat transfer mechanism for transferring heat from said at least one electronic components to said lid, said lid having a major surface having fins extending longitudinally therefrom, and slidably arrangable in interdigitated arrangement with the fins of the heat sink for transferring heat from the field replaceable module to the heat sink.

3. A computer system in accordance with claim 2, wherein:
   said heat sink comprises a cold plate having a channel extending therethrough for circulating a cooling fluid.

4. A computer system in accordance with claim 2, wherein:
   said heat transfer mechanism comprises a interface enhancement material coupled in conductive contact between said electronic component and said lid.

5. A computer system in accordance with claim 2, wherein:
   said self-contained heat transfer mechanism comprises a self-contained liquid cooled system having no liquid coupling external to said field replaceable module.

6. A computer system in accordance with claim 5, wherein:
   said self-contained liquid cooled system comprises:
   a liquid flow path formed inside said lid;
   at least one spray nozzle coupled between said flow path and said inner cavity;
   a cooling liquid circulating in said flow path; and
   a spray pump which circulates said cooling liquid through said flow path thereby causing said cooling liquid to spray into said inner cavity through said at least one spray nozzle.

7. A method for allowing easy exchangeability of a field replaceable module in a running computer system, said computer system comprising a heat sink fixedly mounted in said computer system and comprising a major surface having a plurality of fins extending longitudinally therefrom, and said field replaceable module comprising an electrical connector connectable to said computer system, a printed circuit board electrically connected to said electrical connector, and one or more electronic components electrically connected to said printed circuit board, said method comprising:
   forming a sealed cavity over at least one of said one or more electronic components with a lid, said lid having a major surface having fins extending longitudinally therefrom;
   providing a self-contained heat transfer mechanism for transferring heat from said at least one electronic components to said lid; and
   arranging said fins of said lid in interdigitated arrangement with said fins of said heat sink.

8. A method in accordance with claim 7, comprising:
   allowing electrical connection and/or disconnection of said field replaceable module from said computer system without powering down said running computer system.

9. A method in accordance with claim 7, comprising:
   coupling an interface enhancement material between said at least one electronic components and said lid inside said sealed cavity to conduct heat from said at least one electronic components to said lid.

10. A method in accordance with claim 7, comprising:
    said lid without liquid coupling external to said field replaceable module.

11. A method in accordance with claim 10, wherein said liquid cooling comprises:
    circulating a cooling liquid through a liquid flow path formed inside said lid;

spraying said cooling liquid through at least one spray nozzle coupled between said flow path and said inner cavity; and extracting said sprayed cooling liquid from said inner cavity.

12. A computer system in accordance with claim 2, wherein:

said field replaceable module electrical connector may be electrically connected to and or electrically disconnected from said backplane electrical connector of said powered backplane without powering down said powered backplane.

13. A field replaceable module in accordance with claim 1, wherein said lid encloses substantially all of said one or more electronic components on said printed circuit board.

14. A computer system in accordance with claim 2, wherein:

said lid of said field replaceable module encloses substantially all of said one or more electronic components on said printed circuit board.

* * * * *